United States Patent
Bar et al.

(10) Patent No.: US 9,780,015 B2
(45) Date of Patent: Oct. 3, 2017

(54) INTEGRATED CIRCUIT CHIP ASSEMBLED ON AN INTERPOSER

(71) Applicants: STMicroelectronics SA, Montrouge (FR); STMicroelectronics (Crolles 2) SAS, Crolles (FR)

(72) Inventors: Pierre Bar, Grenoble (FR); Alisee Taluy, Saint Martin d'heres (FR); Olga Kokshagina, Paris (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/204,488

(22) Filed: Jul. 7, 2016

(65) Prior Publication Data

US 2016/0322276 A1 Nov. 3, 2016

Related U.S. Application Data

(62) Division of application No. 14/659,680, filed on Mar. 17, 2015, now Pat. No. 9,418,954.

(30) Foreign Application Priority Data

Mar. 19, 2014 (FR) ..................... 14 52280

(51) Int. Cl.
*H01L 23/367* (2006.01)
*H01L 23/31* (2006.01)
(Continued)

(52) U.S. Cl.
CPC .... *H01L 23/3675* (2013.01); *H01L 21/32139* (2013.01); *H01L 21/4853* (2013.01);
(Continued)

(58) Field of Classification Search
CPC . H01L 23/3114; H01L 21/568; H01L 21/561; H01L 24/97; H01L 25/0652;
(Continued)

(56) References Cited

U.S. PATENT DOCUMENTS 6,221,753 B1    4/2001  Seyyedy
7,667,473 B1    2/2010  Conn et al.
(Continued)

FOREIGN PATENT DOCUMENTS

EP    1703558 A2    9/2006

OTHER PUBLICATIONS

INPI Search Report and Written Opinion for FR 1452280 dated Dec. 5, 2014 (9 pages).

*Primary Examiner* — Evan Pert
*Assistant Examiner* — Changhyun Yi
(74) *Attorney, Agent, or Firm* — Gardere Wynne Sewell LLP

(57) ABSTRACT

A device includes a chip assembled on an interposer. An electrically-insulating layer coats an upper surface of the interposer around the chip. First metal lines run on the upper surface of the interposer and are arranged between conductive elements of connection to the chip. An end of each first metal line is arranged to extend beyond a projection of the chip on the interposer. A thermally-conductive via connects the end of the first metal line to a heat sink supported at an upper surface of the device.

21 Claims, 6 Drawing Sheets

(51) Int. Cl.
*H01L 23/498* (2006.01)
*H01L 21/48* (2006.01)
*H01L 21/56* (2006.01)
*H01L 23/00* (2006.01)
*H01L 21/3213* (2006.01)
*H01L 21/768* (2006.01)
*H01L 23/36* (2006.01)

(52) U.S. Cl.
CPC ...... *H01L 21/4871* (2013.01); *H01L 21/4882* (2013.01); *H01L 21/563* (2013.01); *H01L 21/565* (2013.01); *H01L 21/76897* (2013.01); *H01L 23/3135* (2013.01); *H01L 23/3157* (2013.01); *H01L 23/36* (2013.01); *H01L 23/367* (2013.01); *H01L 23/3677* (2013.01); *H01L 23/49838* (2013.01); *H01L 24/11* (2013.01); *H01L 24/17* (2013.01); *H01L 24/29* (2013.01); *H01L 24/73* (2013.01); *H01L 24/81* (2013.01); *H01L 24/92* (2013.01); *H01L 23/49827* (2013.01); *H01L 24/13* (2013.01); *H01L 24/16* (2013.01); *H01L 24/32* (2013.01); *H01L 24/83* (2013.01); *H01L 2224/13147* (2013.01); *H01L 2224/14131* (2013.01); *H01L 2224/14519* (2013.01); *H01L 2224/29013* (2013.01); *H01L 2224/2919* (2013.01); *H01L 2224/29082* (2013.01); *H01L 2224/29111* (2013.01); *H01L 2224/29147* (2013.01); *H01L 2224/3015* (2013.01); *H01L 2224/30519* (2013.01); *H01L 2224/32225* (2013.01); *H01L 2224/73103* (2013.01); *H01L 2224/73203* (2013.01); *H01L 2224/73204* (2013.01); *H01L 2224/81192* (2013.01); *H01L 2224/81193* (2013.01); *H01L 2224/81801* (2013.01); *H01L 2224/81815* (2013.01); *H01L 2224/83193* (2013.01); *H01L 2224/83801* (2013.01); *H01L 2224/9211* (2013.01); *H01L 2924/12042* (2013.01); *H01L 2924/18161* (2013.01)

(58) Field of Classification Search
CPC ............. H01L 23/5389; H01L 23/5385; H01L 23/5384; H01L 23/5383; H01L 21/56; H01L 23/5226; H01L 24/81; H01L 24/08; H01L 24/16; H01L 24/11; H01L 24/94; H01L 24/05; H01L 24/03; H01L 24/13
USPC .................................. 257/774, 773; 438/126
See application file for complete search history.

(56) References Cited

U.S. PATENT DOCUMENTS

| | | |
|---|---|---|
| 8,786,069 B1 | 7/2014 | Haba et al. |
| 2002/0027294 A1 | 3/2002 | Neuhaus et al. |
| 2003/0035269 A1 | 2/2003 | Chiu |
| 2004/0004292 A1 | 1/2004 | Hsieh et al. |
| 2005/0134507 A1 | 6/2005 | Dishongh et al. |
| 2010/0270646 A1* | 10/2010 | Chan ............ H05K 1/162 257/532 |
| 2011/0285023 A1 | 11/2011 | Shen et al. |
| 2012/0025365 A1 | 2/2012 | Haba |
| 2012/0211885 A1 | 8/2012 | Choi et al. |
| 2013/0105991 A1 | 5/2013 | Gan et al. |
| 2013/0299982 A1* | 11/2013 | Pagaila ............ H01L 21/568 257/738 |
| 2014/0103527 A1 | 4/2014 | Marimuthu et al. |
| 2014/0131856 A1 | 5/2014 | Do et al. |
| 2014/0264818 A1 | 9/2014 | Lowe, Jr. et al. |
| 2015/0001708 A1 | 1/2015 | Lin |
| 2015/0179570 A1* | 6/2015 | Marimuthu ......... H01L 25/0652 257/774 |
| 2015/0236002 A1 | 8/2015 | Haba et al. |
| 2015/0348928 A1 | 12/2015 | Co et al. |

* cited by examiner

INTEGRATED CIRCUIT CHIP ASSEMBLED ON AN INTERPOSER

CROSS-REFERENCE TO RELATED APPLICATION

This application is a divisional application from U.S. patent application Ser. No. 14/659,680 filed Mar. 17, 2015, which claims the priority benefit of French Patent application number 1452280, filed on Mar. 19, 2014, the disclosures of which are hereby incorporated by reference.

TECHNICAL FIELD

The present disclosure relates to an assembly of at least one integrated circuit chip on an interposer and to a method of manufacturing such an assembly.

BACKGROUND

In a so-called three-dimensional integrated circuit assembly, at least one integrated circuit chip is assembled on an intermediate plate currently called interposer. The interposer ensures the connection between the chip(s) and a support of the device arranged on the side of the interposer opposite to that having the chips assembled thereon.

There is a need in the art to improve the transfer of thermal power in a three-dimensional assembly comprising an integrated circuit chip mounted on an interposer to decrease the temperature in the hottest regions of the assembly.

SUMMARY

An embodiment provides a device comprising: a chip assembled on an interposer; an electrically-insulating layer coating the upper surface of the interposer around the chip; first metal lines running on the upper surface of the interposer and being arranged between conductive elements of connection to the chip, at least one end of each first line being arranged beyond the projection of the chip on the interposer; and thermally-conductive vias connecting said at least one end to a heat sink resting on the upper surface of the device.

According to an embodiment, the conductive elements of connection to the chip and the metal lines are made of a same first material and have a same thickness.

According to an embodiment, the width of each of the first lines is smaller than the width of said at least one corresponding end.

According to an embodiment, the first material is copper.

According to an embodiment, each conductive element of connection to the chip is connected by a soldering to a conductive element of connection to the corresponding interposer formed on the chip.

According to an embodiment, second metal lines run on the chip between said elements of connection to the interposer, the second lines being thermally connected to the first corresponding lines by a soldering.

According to an embodiment, the elements of connection to the interposer and the second metal lines are made of a same second material and have a same thickness.

According to an embodiment, an electrically-insulating material fills the free space between the chip and the interposer.

According to an embodiment, the second material is copper.

An embodiment provides a method of manufacturing the assembly of a chip on an interposer, the method comprising the steps of: forming pads on the upper surface of the interposer; depositing a biasing metal layer on the upper surface of the interposer; depositing a masking layer on the biasing layer; etching the masking layer all the way to the biasing layer to form openings in front of the pads and to form trenches; dipping the interposer into an electrolytic bath comprising metal ions and applying a voltage between the biasing layer and an electrode dipped into the electrolytic bath to grow first metal lines in the trenches and elements of connection to the chip in the openings; removing the interposer from the electrolytic bath; removing the masking layer; etching the biasing layer, the first metal lines and the elements of connection to the chip being used as an etch mask; assembling the chip to the upper surface of the interposer by soldering the elements of connection to the chip onto elements of connection to the interposer supported by the active surface of the chip; filling with an electrically-insulating material the free space between the chip and the interposer; depositing an insulating layer on said upper surface, the insulating layer being flush with the surface of the chip opposite to the active surface; and forming thermally-conductive vias through the insulating layer, these vias being connected to the ends of the first lines.

According to an embodiment, second metal lines supported by the active surface of the chip are provided, each second line being thermally connected to the first corresponding line by a soldering formed at the step of chip assembly on the interposer.

According to an embodiment, said trenches comprise flared ends.

According to an embodiment, the method further comprises a step of polishing the upper surface of the assembly and a step of assembling a heat sink on the upper surface of the assembly.

According to an embodiment, the metal ions of the electrolytic bath are copper ions.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION OF THE DRAWINGS

Figure 1A:
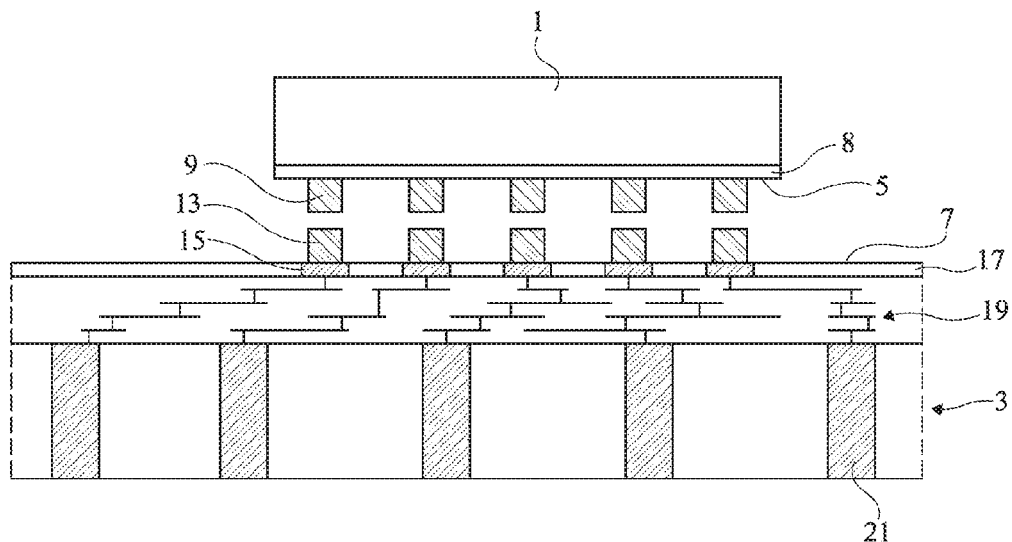
FIGS. 1A and 1B are simplified cross-section views of a chip and of an interposer before and after assembly of the chip on the interposer.

For clarity, the same elements have been designated with the same reference numerals in the various drawings and the various drawings are not to scale.

Figure 1B:
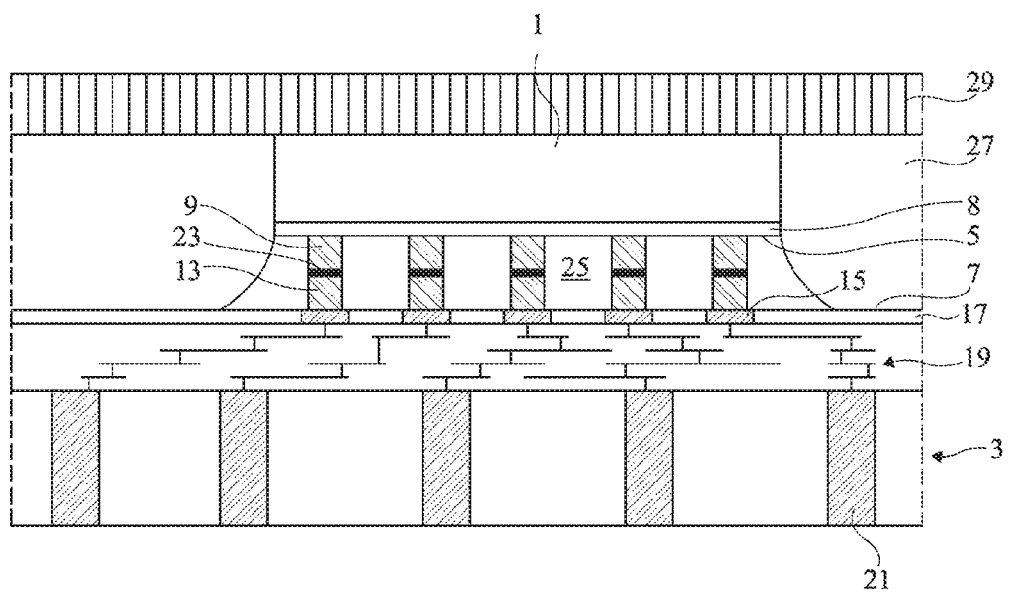

FIGS. 1A and 1B are cross-section views illustrating a three-dimensional assembly of a chip 1 and of an interposer 3, respectively before and after the chip has been assembled on the interposer.

FIG. 1A is an exploded cross-section view showing chip 1 above interposer 3. The chip surface having integrated circuits formed thereon, or active surface 5, faces upper surface 7 of the interposer. Active surface 5 supports an interconnection network 8 (not shown in detail) intended to connect terminals of the chip to one another and to connection elements 9, such as metal micro-pillars, supported by active surface 5.

Upper surface 7 of the interposer comprises connection elements 13 similar to connection elements 9 of the chip, elements 9 and 13 facing one another. Each connection element 13 is supported by a pad 15 formed on top and inside of a passivation layer 17, pads 15 being electrically connected to the last metal level of interconnection network 19. The interposer comprises through vias 21, each of which connects a pad (not shown) of the lower surface of the interposer to pads 15 via interconnection network 19.

In FIG. 1B, chip 1 is assembled on interposer 3. Each connection element 9 of the chip is connected to a connection element 13 of the interposer by a soldering 23. An electrically-insulating material 25, for example, a resin injected after soldering, fills the space between active surface 5 of the chip and upper surface 7 of the interposer, around connection elements 9 and 13. An electrically-insulating layer 27, for example, a resin, covers upper surface 7 of the interposer around the chip. A heat sink 29 rests on the upper surface of the assembly.

In this assembly, interposer 3 enables to adapt the narrow pitch of connection elements 13 to the wider pitch of the connection elements (not shown) on the lower surface side of the interposer. On the lower surface side of the interposer, the pitch of the connection elements corresponds to the possible pitch of the connections of a support on which the assembly will be assembled. This support may be a final support such as a printed circuit board. The support may also be an intermediate support forming a second interposer.

In operation, the components of chip 1 generate heat. The generated thermal power is partly diffused all the way to heat sink 29 across the chip thickness. Due to the limited heat conductivity of chip 1, the thermal power may not be properly removed towards heat sink 29. The temperature of certain regions of the chip and of the assembly may then increase enough to cause a deterioration thereof.

Figure 2A:
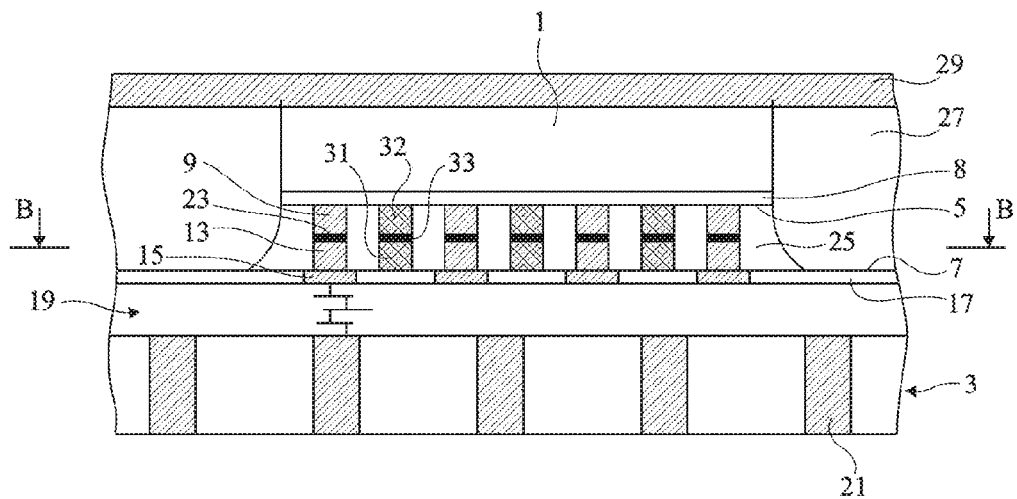
FIGS. 2A, 2B, and 2C are simplified cross-section views of an embodiment of an assembly of a chip on an interposer.
Figure 2B:
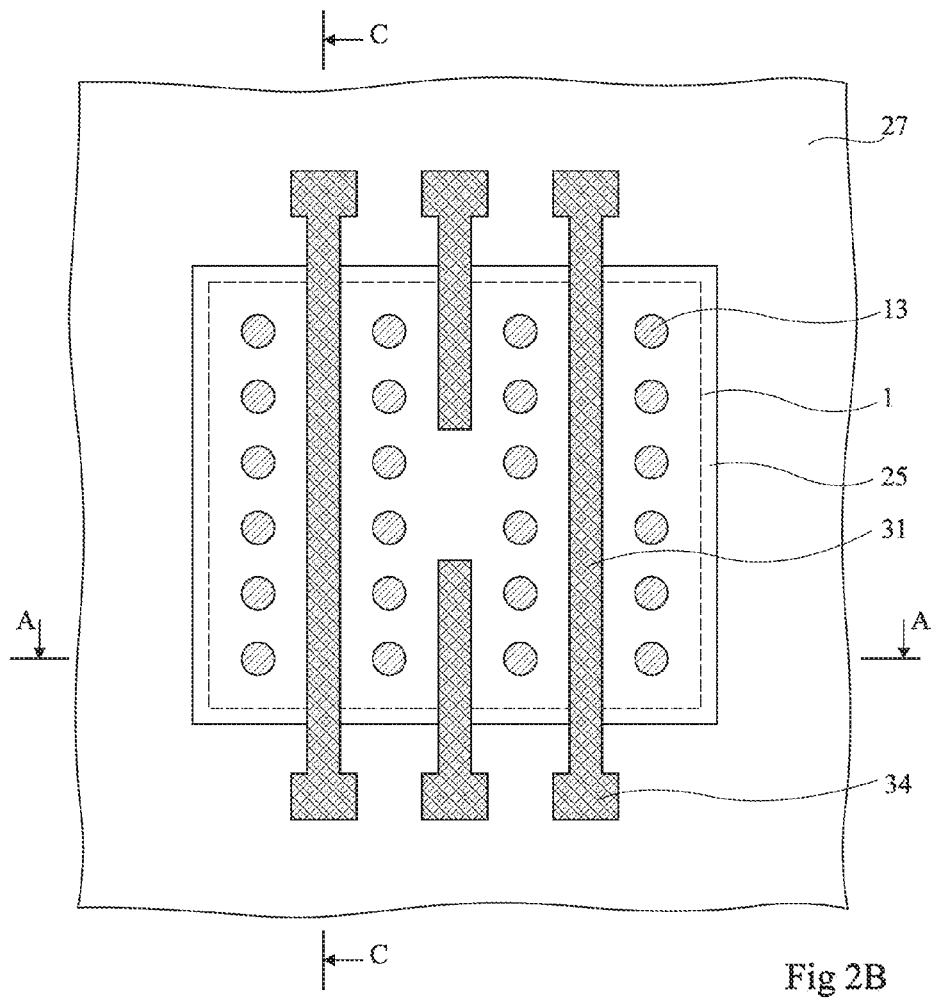
Figure 2C:
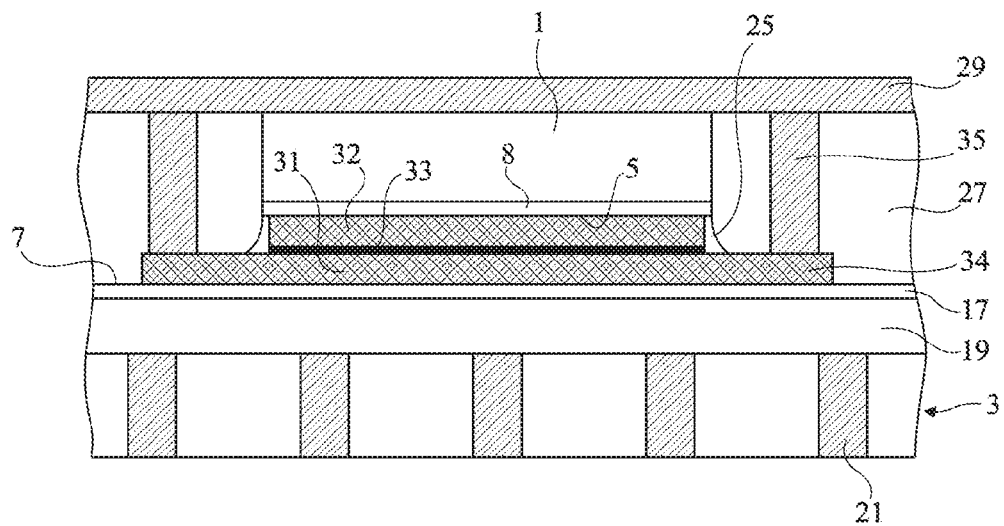

FIGS. 2A, 2B, and 2C schematically show an embodiment of an assembly of a chip 1 on an interposer 3, the interposer forming a portion of a silicon wafer having several interposers formed therein. FIGS. 2A and 2C are cross-section views of FIG. 2B respectively along cross-section planes AA and CC, FIG. 2B being a top view of FIGS. 2A and 2C along plane BB.

The assembly comprises same elements as the assembly of FIG. 1B designated with same reference numerals, that is: a chip 1 assembled on an interposer 3, each of elements 13 of connection of the interposer being electrically connected by a soldering 23, for example, made of a tin and silver alloy, to a chip connection element 9; an electrically-insulating material 25 arranged between the interposer and the chip around the connection elements; an electrically-insulating layer 27 coating the interposer around the chip; and a heat sink 29, for example, a metal sheet, for example, made of copper, resting on the upper surface of the assembly.

This assembly further comprises metal lines 31 running on upper surface 7 of interposer 3 and, preferably, metal lines 32 running on active surface 5 of chip 1 and soldered to the corresponding lines 31 by a soldering 33. Lines 31 and 32 are arranged between connection elements 13 and 9, the lines being electrically insulated therefrom by material 25. Lines 31 and 32 are also electrically insulated from interconnection networks 19 and 8 of the interposer and of the chip, for example, by a passivation layer 17. Lines 31 extend beyond the projection of chip 1 (in dotted lines in FIG. 2B) and their ends arranged under layer 27 comprise a flaring 34. Thermally-conductive vias 35 (FIG. 2C) cross layer 27 and thermally connect flared areas 34, and thus lines 31, to heat sink 29. Flared areas 34 ease the connection of the vias to the ends of the metal lines.

Metal lines 31 and 32, although preferably extending continuously under the entire chip 1, may, if necessary, be interrupted, as shown in the central portion of FIG. 2B.

In operation, heat is generated by the components formed on the side of active surface 5 of chip 1. A significant portion of the thermal power thus generated is transferred by metal lines 31 and 32 all the way to heat sink 29 using vias 35. A thermal bridge has thus been formed between the chip surface on the interposer side and an external heat sink. According to a first variation, lines 32 on the chip side are not formed and electrically-conductive material 25 is provided to be thermally conductive. The thermal energy is then transmitted from chip 1 to lines 31 via material 25.

According to a second variation, lines 32 on the chip side are replaced with a sequence of connection elements similar to connection elements 9.

Lines 31 may further be provided to be thermally connected by conductive elements, not shown, to vias 21 crossing the interposer. Part of the thermal energy is then transmitted from chip 1 to the lower surface of the interposer via these vias 21.

Chip 1 may be a thinned chip having a 2 mm surface area with a thickness in the range from 80 to 200 µm, for example 100 µm. The interposer thickness may be in the range from 70 to 200 µm, for example, 80 µm. Insulating material 25 may be a resin, preferably, a thermosetting polymer such as an epoxy polymer currently designated as WLUF ("Wafer Level Underfill>>") as described in article "Performance of Wafer-Level Underfill with 50 µm pitch interconnections: Comparison with conventional underfill" by A. Taluy et al. published in 2011 in Electronics Packaging Technology Conference (incorporated by reference). Insulating layer 27 may be a resin, for example, a thermosetting polymer such as an epoxy polymer.

Connection elements 9 and 13 may be micro-pillars having a diameter in the range from 20 to 30 µm, for example, 25 µm, and having a thickness in the range from 5 to 25 µm, for example, 15 µm, the micro-pillars being for example made of copper. Advantageously, metal lines 31 are formed at the same time as connection elements 13, are made of the same material and have the same thickness. Similarly, metal lines 32 are formed at the same time as connection elements 9, are made of the same material and have the same thickness. The width of lines 31 and 32 may be in the range from 10 to 25 µm, for example, 20 µm. The width of a flaring 34 may be in the range from 10 to 30 µm, for example, 25 µm. The interval between a line and the closest connection element may be in the range from 10 to 25 µm, for example, 20 µm.

Figure 3A:
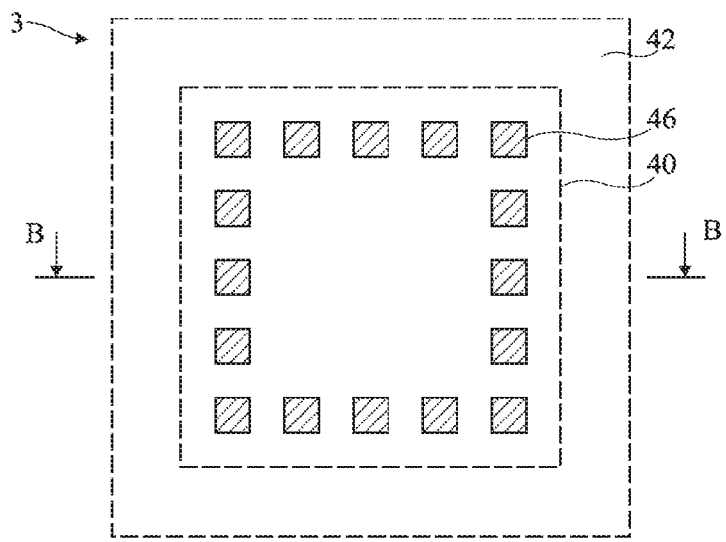
FIGS. 3A-3B and 4A-4B are simplified views illustrating steps of manufacturing a contact pad.
Figure 3B:
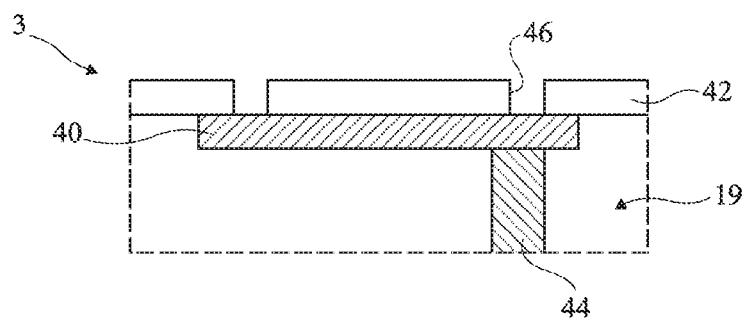

FIG. 3A is a top view schematically showing a portion of the upper surface of interposer 3 at a location where a pad 15 is desired to be formed. FIG. 3B is a cross-section view along plane BB of FIG. 3A through the upper portion of interconnection network 19 of the interposer. A portion 40 of the last metal level of network 19 is arranged under an insulating layer 42, for example, a silicon oxide layer. This portion 40, having dimensions in the order of those desired for pad 15, faces the location where pad 15 is desired to be manufactured. Portion 40 is electrically connected to the rest of interconnection network 19 by a via 44. Openings 46 have been formed through insulating layer 42 all the way to portion 40. Openings 46 are regularly arranged, at the periphery or in a grid pattern, to join portion 40 (in dotted lines in FIG. 3A). In top view, each opening 46 is square-shaped.

Figure 4A:
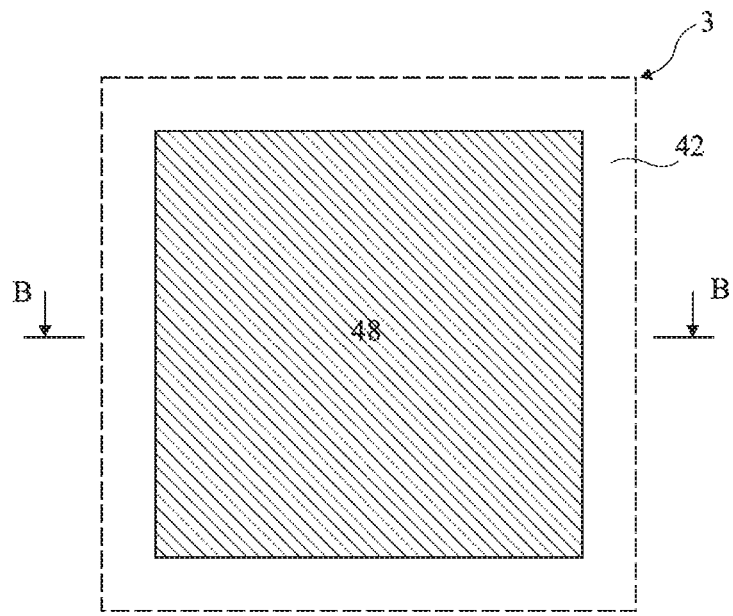
Figure 4B:
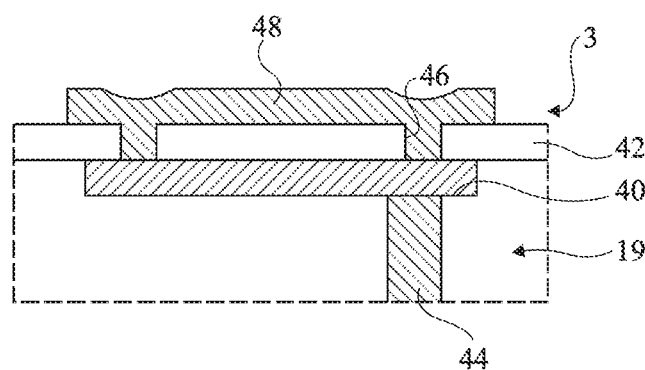

FIGS. 4A and 4B are respective top and cross-section views of interposer portion 3 of FIGS. 3A and 3B after a step of depositing a metal layer which covers the structure and fills openings 46. This layer is then etched according to a pattern 48 which extends beyond the external periphery of openings 46 and which corresponds to a pad 15.

As an example, each opening 46 has sides with a length in the range from 0.5 to 2 μm, for example, 1.5 μm. The interval between an opening 46 and the closest opening may be in the range from 1 to 2 μm, for example, 1.5 μm. Pad 15 may have the shape of a square with sides having a length in the range from 25 to 100 μm, for example, 25 μm. Pad 15 may be a portion of an aluminum layer having a thickness in the range from 0.6 to 2 μm, for example, FIGS. 5A to 5C illustrate steps of the manufacturing of connection elements 13 and of metal lines 31 on upper surface 7 of interposer 3.

Figure 5A:
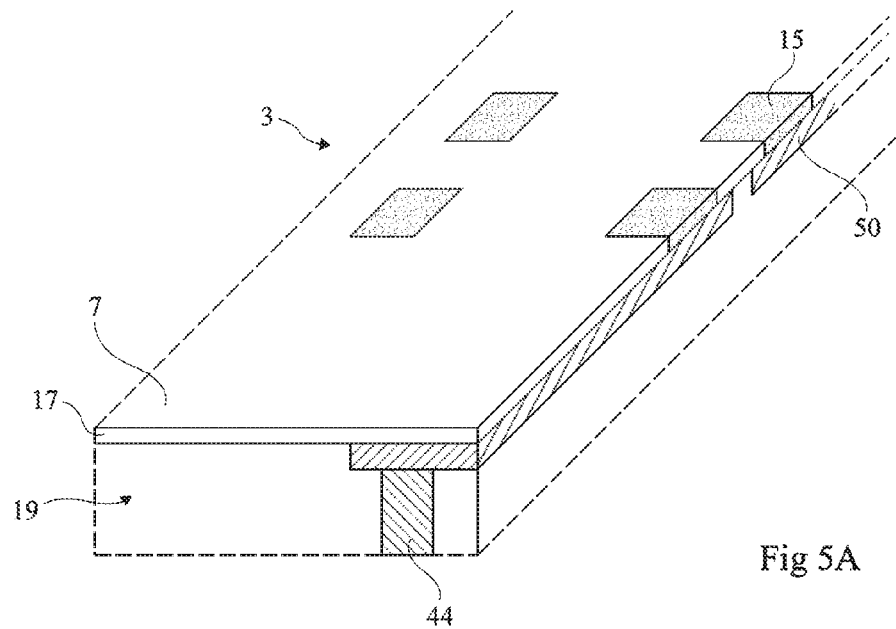
FIGS. 5A-5C and FIG. 6 illustrate steps of manufacturing of an embodiment of an assembly of a chip on an interposer.

FIG. 5A is a cross-section and perspective view showing a portion of upper surface 7 and of the upper surface of interconnection network 19 of interposer 3. In this drawing, pads 15 have been formed at the locations where connection elements 13 are desired to be formed, for example, according to the method previously described in relation with FIGS. 3A-3B and 4A-4B. Between the pads, upper surface 7 of the interposer is coated with a passivation layer 17. Each pad 15 is in contact with a last metal level 50 of interconnection network 19. This metal level formed under layer 17 is connected to the rest of the network by one or a plurality of vias 44.

Figure 5B:
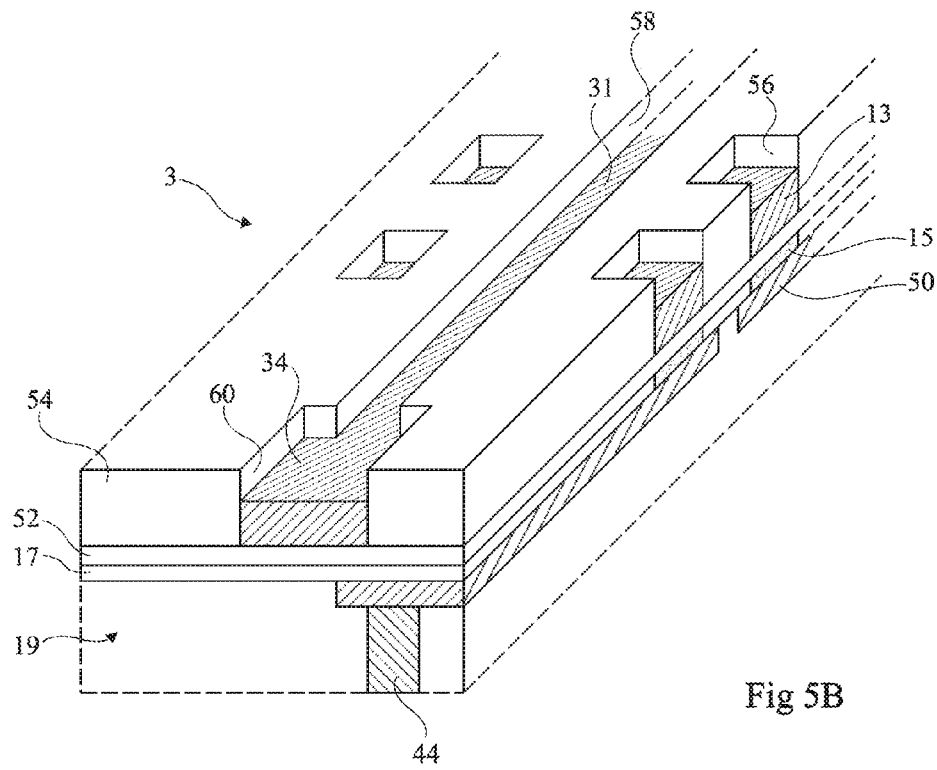
Figure 5C:
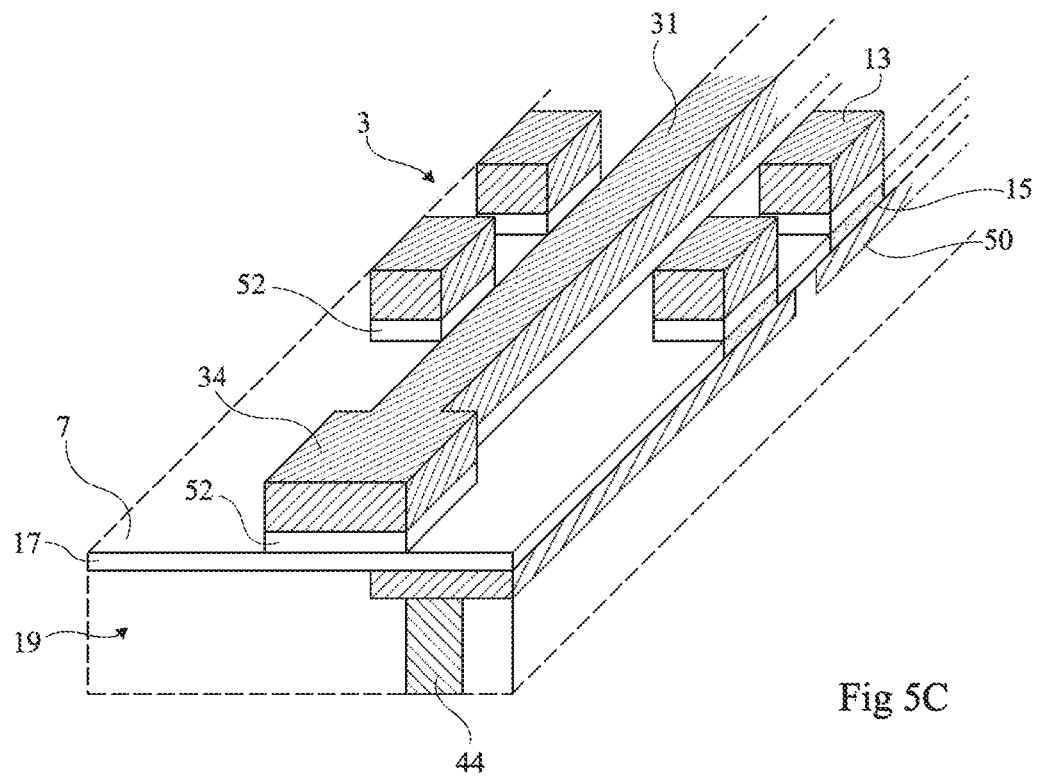

FIG. 5B is a cross-section and perspective view of the interposer portion shown in FIG. 5A after steps of:

depositing a biasing metal layer 52 on upper surface 7 of the interposer;

depositing a masking layer 54;

etching masking layer 54 all the way to layer 52 to form openings 56 facing pads 15 and to form trenches 58 having flared areas 60 at their ends, the trenches and their flared areas being formed at the locations where metal lines 31 and their flared ends 34 are desired to be manufactured;

dipping the silicon trench having interposer 3 formed therein into an electrolytic bath comprising metal ions; and applying a voltage between an electrode dipped into the electrolytic bath and biasing layer 52 to grow metal lines 31 and connection elements 13 on layer 52, respectively in trenches 58 and in openings 56.

As an example, biasing layer 52 may be a layer or a stack of layers, for example, made of titanium, tungsten, copper, or of an alloy of these materials, where the thickness of the biasing layer may be in the range from 0.1 to 1 μm, for example, 0.5 μm. Masking layer 54 may be a resin layer having a thickness selected to be greater than the desired thickness of connection elements 13 and of lines 31, for example, equal to 100 μm for connection elements 13 and lines 31 having a height, for example, of 25 μm.

FIG. 5C is a cross-section and perspective view of the interposer portion shown in FIG. 5B after steps of:

removing the interposer from the electrolytic bath when lines 31 and contact elements 13 have reached the desired thickness;

removing masking layer 54, and etching biasing layer 52, lines 31, and connection elements 13 used as an etch mask.

An interposer 3 having its upper surface 7 supporting metal lines 31 arranged between connection elements 13 electrically connected to interconnection network 19 via pads 15 is obtained.

Preferably, metal lines 32 are formed on active surface 5 of chip 1 at the same time as connection elements 9 according to the method described in relation with FIGS. 5A to 5C.

Figure 6:
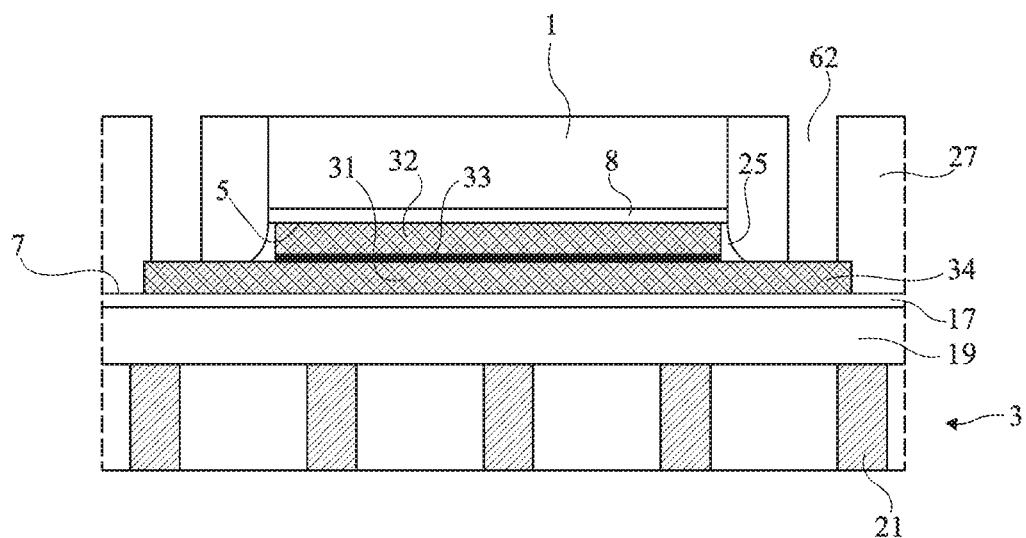

FIG. 6 is a simplified cross-section view in the same plane as FIG. 2C, this drawing illustrating a chip assembled on an interposer. Active surface 5 of the chip comprises lines 32 between connection elements 9 and the upper surface of the interposer comprises lines 31 between connection elements 13. The assembly of FIG. 6 is obtained after the steps of:

arranging an electrically-insulating material 25 (WLUF) between the chip and the interposer, around lines 31 and 32 and connection elements 9 and 13, material 25 being preferably thermally conductive;

depositing an insulating layer 27 on the upper surface of the interposer so that the layer covers chip 1;

preferably, polishing layer 27 so that it is flush with the surface of chip 1 facing active surface 5;

forming openings 62 through layer 27 all the way to flared areas 34 of lines 31, for example, by piercing layer 27 by means of a laser.

The assembly shown in FIGS. 2A, 2B, and 2C is then obtained from the assembly of FIG. 6 after the steps of:

filling, for example, with a squeegee, openings 62 with a thermally-conductive paste, this paste being liquid at ambient temperature;

curing the conductive paste to form thermally-conductive vias 45; and assembling a radiator 29 on the upper surface of the assembly.

As an example, the conductive paste is a resin filled with metal flakes cured in a heating step. The resin may be a polymer such as a polyamide. The metal flakes may be copper flakes. The heat sink may be a copper sheet glued to the upper surface of the assembly by a glue optimized to have a minimum thermal resistance.

The silicon wafer having the interposer formed therein is then cut to separate chip assembly 1 on interposer 3 from the other assemblies formed inside and on top of this wafer. This assembly is then secured to a support as described in relation with FIGS. 1A and 1B.

Specific embodiments have been described. Various alterations, modifications, and improvements will occur to those skilled in the art. In particular, although an assembly where chip 1 is a thinned chip has been described, it may also be a non-thinned chip having a thickness in the range from 600 to 800 μm. Further, the chip components may be made in a solid substrate, for example, made of silicon, or in a semiconductor layer of a semiconductor-on-insulator (SOI) structure.

Moreover, although, in the previously-described embodiments, the chip is assembled on the interposer via micro-pillars, the chip may be assembled on the interposer and electrically connected thereto by other types of conductive elements, for example, metal bumps.

In each of the previously-described assemblies, heat sink 29 is a metal sheet glued to the upper surface of the assembly. Other types of heat sinks may be assembled on the upper surface of the assembly, for example, a fin-type heat sink.

The order of the previously-described manufacturing method steps may be modified. Further, steps may be added, modified, or suppressed, for example, it is possible not to perform the planarization step of layer 27 described in relation with FIG. 6.

Many variations of such a structure are possible. For example, it may be provided for several chips to be assembled on the interposer and for one at least of these chips to be used as a support for at least another chip. It may further be provided for integrated circuits to be formed inside and on top of at least one surface of the interposer.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method, comprising:
   forming a plurality of conductive pads on an interposer;
   depositing a biasing metal layer on an upper surface of the interposer;
   depositing a masking layer on the biasing metal layer;
   etching through the masking layer to form openings at locations corresponding to locations of the conductive pads;
   electrolytically growing on the biasing metal layer and in the openings metal connection elements;
   removing the masking layer; and
   etching the biasing metal layer using the metal connection elements as an etch mask, wherein etching the biasing metal layer reveals the upper surface of the interposer.

2. The method of claim 1, further comprising mounting an integrated circuit chip to the interposer by soldering chip connection elements to said metal connection elements.

3. The method of claim 2, further comprising filling a free space between the integrated circuit chip and the interposer with an electrically-insulating material.

4. The method of claim 3, further comprising depositing an insulating layer surrounding the integrated circuit chip.

5. The method of claim 4, further comprising forming thermally-conductive vias extending through the insulating layer to make contact with a conductive line of said interposer.

6. The method of claim 4, further comprising: polishing an upper surface of the insulating layer; and
   assembling a heat sink on the polished upper surface.

7. A method, comprising:
   depositing a biasing metal layer on an upper surface of an interposer;
   depositing a masking layer on the biasing metal layer;
   etching through the masking layer to form a trench extending along a length of the interposer;
   electrolytically growing on the biasing metal layer and in the trench a metal line;
   removing the masking layer; and
   etching the biasing metal layer using the metal line as an etch mask, wherein etching the biasing metal layer reveals the upper surface of the interposer.

8. The method of claim 7, further comprising mounting an integrated circuit chip to the interposer by soldering a chip connection element to said metal line.

9. The method of claim 8, further comprising filling a free space between the integrated circuit chip and the interposer with an electrically-insulating material.

10. The method of claim 9, further comprising depositing an insulating layer surrounding the integrated circuit chip.

11. The method of claim 10, further comprising forming thermally-conductive vias extending through the insulating layer to make contact with an end of said metal line which projects out beyond an edge of the integrated circuit chip.

12. The method of claim 10, further comprising: polishing an upper surface of the insulating layer; and
    assembling a heat sink on the polished upper surface.

13. A method, comprising:
    forming conductive pads on an interposer;
    depositing a biasing metal layer on an upper surface of the interposer;
    depositing a masking layer on the biasing metal layer;
    etching through the masking layer to form openings in front of the conductive pads and to form trenches;
    dipping the interposer into an electrolytic bath comprising metal ions and applying a voltage between the biasing metal layer and an electrode dipped into the electrolytic bath to grow elements of connection in the openings and grow metal lines in the trenches;
    removing the masking layer; and
    etching the biasing metal layer using the elements of connection and metal lines as an etch mask, wherein etching the biasing metal layer reveals the upper surface of the interposer.

14. The method claim 13, further comprising:
    assembling an integrated circuit chip to the interposer by soldering the integrated circuit chip to said elements of connection; and
    filling a free space between the integrated circuit chip and the interposer with an electrically-insulating material.

15. The method of claim 13, further comprising:
    assembling an integrated circuit chip to the interposer by soldering the integrated circuit chip to said elements of connection; and
    depositing an insulating layer to surround the integrated circuit chip.

16. The method of claim 15, further comprising forming thermally-conductive vias extending through the insulating layer, the thermally-conductive vias being connected to ends of the metal lines.

17. The method of claim 13, wherein said trenches comprise flared ends.

18. The method of claim 16, further comprising:
    polishing an upper surface of the insulating layer; and
    assembling a heat sink on the polished upper surface of the insulating layer.

19. The method of claim 13, wherein the metal ions of the electrolytic bath are copper ions.

20. A method, comprising:
    forming a plurality of conductive pads, each conductive pad having an upper surface disposed coplanar with an upper surface of an interposer;
    depositing a biasing metal layer on the upper surfaces of the interposer and the plurality of conductive pads;
    depositing a masking layer on the biasing metal layer;
    etching through the masking layer to form openings at locations corresponding to the plurality of conductive pads;
    electrolytically growing metal connection elements on the biasing metal layer and in the openings;
    removing the masking layer; and
    etching the biasing metal layer using the metal connection elements as an etch mask, wherein etching the biasing metal layer reveals the upper surface of the interposer.

21. The method of claim 20 wherein the upper surface of the interposer is an upper surface of a passivation layer, and wherein etching the biasing metal layer reveals the upper surface of the passivation layer.

* * * * *

UNITED STATES PATENT AND TRADEMARK OFFICE
CERTIFICATE OF CORRECTION

PATENT NO. : 9,780,015 B2  Page 1 of 1
APPLICATION NO. : 15/204488
DATED : October 3, 2017
INVENTOR(S) : Pierre Bar et al.

It is certified that error appears in the above-identified patent and that said Letters Patent is hereby corrected as shown below:

In the Specification

At Column 4, Line number 28, please replace the term [[2 mm]] with -- 2 $mm^2$ --.

Signed and Sealed this
Twenty-first Day of November, 2017

Joseph Matal
*Performing the Functions and Duties of the*
*Under Secretary of Commerce for Intellectual Property and*
*Director of the United States Patent and Trademark Office*